United States Patent

Funato et al.

[11] Patent Number: 5,882,807
[45] Date of Patent: Mar. 16, 1999

[54] JIG FOR HEAT TREATMENT AND PROCESS FOR FABRICATING THE JIG

[75] Inventors: Yoshio Funato, Kanagawa; Koji Furukawa, Yokohama; Hisao Yamamoto; Nobuo Kageyama, both of Hyogo, all of Japan

[73] Assignees: Asahi Glass Company, Ltd; Tokai Carbon Company, Ltd., both of Tokyo, Japan

[21] Appl. No.: 770,239

[22] Filed: Dec. 20, 1996

[30] Foreign Application Priority Data

Dec. 26, 1995 [JP] Japan ................................. 7-352098

[51] Int. Cl.⁶ .................................................. C04B 35/56
[52] U.S. Cl. ...................... 428/698; 428/446; 428/336; 118/726; 269/38; 432/156; 432/262; 432/264; 432/265
[58] Field of Search ..................... 428/446, 698; 269/38; 118/726; 432/156, 262, 264, 265

[56] References Cited

U.S. PATENT DOCUMENTS

| | | | |
|---|---|---|---|
| 4,301,132 | 11/1981 | Kennedy | 501/90 |
| 4,564,494 | 1/1986 | Gupta et al. | 501/88 |
| 4,597,923 | 7/1986 | Kennedy | 264/62 |

FOREIGN PATENT DOCUMENTS 0340802  11/1989  European Pat. Off. .

*Primary Examiner*—Archene Turner
*Attorney, Agent, or Firm*—Flynn, Thiel, Boutell & Tanis, P.C.

[57] ABSTRACT

A jig used for heat treatment made from an SiC-coated silicon carbide material, wherein the SiC film is coated by the CVD method on a silicon carbide matrix in which silicon has been impregnated and wherein there are no pores with a diameter of 2 $\mu$m or larger in the outer layer of the matrix within 200 $\mu$m from the interface of the SiC film and the silicon carbide matrix when observed by a scanning electron microscope at a magnification of 400 times. The jig is manufactured by producing an SiC film on the surface of a silicon carbide matrix in which silicon has been impregnated by introducing a raw material compound for producing the SiC film and forming the SiC film at a temperature from 1000° C. to 1290° C. under a pressure from 500 to 760 Torr in a non-oxidative atmosphere. The jig exhibits superior resistance to high temperature heating cycles and excellent high thermal shock resistance required for heat treatment in semiconductor manufacturing.

4 Claims, No Drawings

JIG FOR HEAT TREATMENT AND PROCESS FOR FABRICATING THE JIG

BACKGROUND OF THE INVENTION

1. Field of the Invention

The present invention relates to a jig made from a material having high purity, superior resistance to high temperature heating cycles, and superb high thermal shock resistance, and thus is suitable for use as a jig for heat treatment used in the manufacture of semiconductors.

2. Description of the Background Art

A jig used for heat treatment of liner tubes, process tubes, wafer boats, and the like which are used in diffusion furnace in the manufacture of semiconductors must not only have a superior resistance to high temperature heating cycles (such as rapid heating and quenching), excellent high thermal shock resistance, and superb mechanical strength, it also must exhibit sufficient resistance to contamination to protect high-purity silicon wafers from being contaminated.

High-purity quartz has conventionally been used as a material in the jig used for such a heat treatment. The resistance of the high-purity quartz to a high temperature treatment, however, has become insufficient with the increases in the temperatures used for such a heat treatment. A silicon carbide material with silicon impregnated therein has been developed as a material to substitute for the high-purity quartz (U.S. Pat. No. 3,951,587). Impurities contained in this silicon carbide material, however, diffuse and come out on the surface, making the impurity level of this material higher than that of the high-purity quartz.

A silicon carbide sintered material prepared by providing a film of a ultrahigh purity silicon carbide by a CVD method (chemical vapor deposition method) on a silicon carbide matrix in which silicon has been impregnated has been proposed for use as a part in the manufacture of semiconductors to overcome this problem (Japanese patent No. 1682754). As disclosed in U.S. Pat. No. 3,157,541, formation of SiC films by the CVD method is carried out by either the pyrolysis of an organic silicon-containing compound, such as methyltrichlorosilane ($CH_3SiCl_3$) or methyldichlorosilane ($CH_3SiHCl_2$), or by the reaction of a silicon compound such as $SiCl_4$ and a carbon compound such as $CH_4$ to cause SiC to deposit with heating.

The formation of a SiC film is very effective for preventing the vaporization of impurities. However, when the SiC film is formed by the CVD method on the silicon carbide substrate in which silicon has been impregnated, resistance to high temperature heating cycles and high thermal shock resistance delicately change according to the conditions of the interface between the matrix and the SiC coating layer. This can cause cracks in or peeling of the SiC film, when the product is used as a semiconductor part which may suffer from a severe heat history.

In addition, part of the silicon impregnated in the silicon carbide matrix may easily vaporize and produce pores close to the surface of the substrate, resulting in impaired adhesion of the SiC film to the silicon carbide substrate. This will cause peeling of the SiC film from heat shock or high temperature heat cycles. Furthermore, if pinholes are produced due to impaired adhesion of the SiC film, part of the impregnated silicon may erode and dissolve out, thereby producing pores. Such pores permit impurities to accumulate and can be a source of such impurities.

A method for improving adhesion of the SiC film by causing SiC crystals to grow in the same orientation has been proposed (Japanese Patent Application Laid-open No. 210276/1988). Because the SiC film is formed at a temperature higher than the melting point of silicon in this method, a great number of pores are produced in the silicon carbide substrate, resulting in a decrease in the strength of the substrate.

Some inventors belonging to the inventive entity of the present invention have previously proposed a process for forming a SiC film on silicon-impregnated silicon carbide ceramics without producing pores. The process comprises heating a silicon carbide ceramic material in which silicon has been impregnated at a temperature of 850° C. to 1000° C. under a reduced pressure, introducing a reaction gas for forming SiC, thereby producing a SiC film while raising the temperature from 1200° C. to 1400° C. without cooling the product (Japanese Patent Application Laid-open No. 65374/1992). In this process, formation of the SiC film is initiated at a temperature below 1000° C. at which the rate of vaporization of silicon is small, then the temperature is raised to 1000° C. or higher. The film which has been formed at lower temperatures controls the vaporization of the silicon, even though the temperature is raised to 1000° C. or higher, whereby the number of pores which are formed can be reduced.

To resolve the above-mentioned problems existing in the conventional process for producing an SiC film by chemical vapor deposition on the silicon-impregnated silicon carbide substrate used as semiconductor manufacturing parts, the present inventors have conducted extensive studies on the relationship between the properties at the interface of the substrate and the SiC coating layer and heat resistance characteristics of the resulting silicon carbide substrate, the factors for the formation of pores in the course of the SiC film production, and the like, on the basis of the above-mentioned process for forming a SiC film wherein the film formation is initiated in a temperature range of 850° C. to 1000° C.

SUMMARY OF THE INVENTION

Specifically, an object of the present invention is to provide a jig exhibiting superior resistance to high temperature heating cycles and high thermal shock resistance, and suitable for use as a jig for heat treatment in the manufacture of semiconductors.

Another object of the present invention is to provide a process for preparing a jig used for heat treatment in semiconductor manufacture, from a SiC-coated silicon carbide material in which silicon has been impregnated, wherein the SiC is coated with closer adhesion to the silicon carbide substrate than that obtained by the chemical vapor deposition method.

Still another object of the present invention is to provide a process for preparing a jig used for heat treatment in semiconductor manufacture, from a SiC-coated silicon carbide material which is of high purity and does not contaminate the silicon wafers.

To achieve these objects, the jig used for heat treatment of the present invention is made from a SiC-coated silicon carbide material, wherein the SiC film is coated by the CVD method on a silicon carbide material in which silicon has been impregnated and wherein there are no pores with a diameter of 2 μm or larger in the outer layer of the substrate within 200 μm from the interface of the SiC film and the silicon carbide material, when observed by a scanning electron microscope at a magnification of 400 times.

The strength of the bond between a SiC film layer and a ceramic substrate when the former is coated onto the surface of the latter by the chemical vapor deposition method is greatly affected by the closeness and adhesion of the interface section. In particular, in the silicon-impregnated silicon carbide substrate on which a SiC film has been coated, tightness or closeness of the structure within 200 μm from the interface of the silicon carbide substrate and the SiC film greatly affects the strength of the bond between the CVD layer and substrate. If pores with a diameter larger than 2 μm exist within a depth of 200 μm, cracks or peeling may occur when the product is subjected to a severe heat history. According to the present invention, resistance to high temperature heating cycles and high thermal shock resistance which can withstand a severe heat history can be obtained by a structure wherein there are no pores with a diameter of 2 μm or larger in the outer layer of the silicon carbide substrate within 200 μm from the interface of the SiC film and the substrate. The pore diameter here is that observed in a measurement using a scanning type electron microscope at a magnification of 400 times.

The high thermal shock resistance of the material is increased by increasing the orientation of SiC film crystals to the (111) plane in X-ray diffraction by keeping the ratio of the diffraction intensity of the (200) plane to the (111) plane, I(200/I(111), at 0.005 or less. In this instance, the value of the X-ray diffraction intensity is that measured by the K α line of Cu, and X-ray diffraction intensity is measured under conditions of an accelerated voltage of 40 KV, an electric current of 20 mA, Cu/Ni filter, and a divergence slit of 1°.

Furthermore, the process for manufacturing the jig for heat treatment of the present invention comprises producing a SiC film on the surface of a silicon carbide substrate in which silicon has been impregnated by introducing a raw material compound for producing and forming the SiC film at a temperature from 1000° C. to 1290° C. and a pressure from 500 to 760 Torr in a non-oxidative atmosphere.

Other objects, features and advantages of the invention will hereinafter become more readily apparent from the following description.

DETAILED DESCRIPTION OF THE INVENTION AND PREFERRED EMBODIMENTS

The silicon-impregnated silicon carbide used as the substrate in the present invention is that produced by impregnating fused silicon in recrystallized silicon carbide which has been produced by sintering a formed body of silicon carbide at a high temperature. Alternatively, such a substrate may be sintered silicon carbide produced from a formed body of silicon carbide and carbon by impregnating fused silicon and treating it at a high temperature. The silicon content in these matrixes is about 5–30 wt %.

The process for forming a SiC film on the surface of such a silicon-impregnated silicon carbide substrate by the chemical vapor deposition method preferably comprises a first step of degassing the silicon-impregnated silicon carbide substrate at a pressure of 1 Torr or less and heating at a temperature of 600°–850° C. at a heating rate of 5°–50° C./min, a second step of introducing a non-oxidative gas until the pressure reaches 50–760 Torr and heating to 1000°–1290° C. at a heating rate of 5°–50° C./min, and a third step of introducing a raw material for silicon carbide together with a carrier gas and forming a silicon carbide film at a temperature of 1000°–1290° C. and 500–760 Torr.

Given as examples of the raw material compound are organo silicon compounds containing Si and C in a molecule, such as methyltrichlorosilane ($CH_3SiCl_3$) and methyldichlorosilane ($CH_3SiHCl_2$). Alternatively, a combination of a silicon compound such as $SiCl_4$ and a carbon compound such as $CH_4$ may be used. As a carrier gas, a non-oxidative gas such as hydrogen gas or argon gas can be given as examples. It is desirable that the carrier gas and the raw material compound be introduced at a molar ratio of (carrier gas/raw material compound) of 4–100. When a silicon compound and a carbon compound are used in combination, the molar ratio reduced to silicon carbide is applicable.

The heating rate in the first and second steps is 5°–50° C./min. If this heating rate exceeds 50° C./min, thermal stress may be produced in the substrate, which may cause cracks. If lower than 5° C./min, productivity is impaired. A preferred range for the rate of temperature rise is 10°–30° C./min. If the pressure after degassing is higher than 1 Torr in the first step, the surface of the silicon carbide substrate may be oxidized by residual oxygen or moisture, which may decrease the corrosion resistance and adhesion of the silicon carbide film to the substrate. A heating temperature lower than 600° C. in the first step is undesirable because adsorbed oxygen is removed insufficiently and may easily oxidize the surface of the silicon carbide substrate. On the other hand, a heating temperature higher than 850° C. causes silicon to evaporate under the reduced pressure and pores tends to be easily produced in the silicon carbide substrate, resulting in decreased adhesion of the silicon carbide film to the substrate. If the pressure is higher than 760 Torr in the second step, hydrogen gas may easily escape, resulting in needless consumption of hydrogen gas. In addition, a higher pressure requires a reinforced pressure vessels and complicated equipment.

In the second and third steps, the heating rate and conditions of the CVD reaction system, such as temperature and pressure, are controlled below the vapor pressure of silicon to prevent the silicon impregnated in the silicon carbide substrate from being vaporized from the surface of the substrate. The jig for heat treatment of the present invention, which consists of the SiC-coated silicon carbide, can be obtained only by controlling the conditions in the second and third steps in this manner. Specifically, if the pressure in the second step is less than 50 Torr, or if the temperature is more than 1290° C. or the pressure is less than 500 Torr in the third step, impregnated silicon existing in the outer layer of the silicon carbide substrate may vaporize with heat, producing pores in the outer layer of the substrate. Furthermore, if the heating temperature is lower than 1000° C. in the third step, the growing rate of the SiC film is suppressed, even if vaporization of the silicon is decreased. In addition, if the pressure is in excess of 760 Torr in the third step, silicon carbide powder is produced before the gas of the raw material compound is deposited on the surface of the silicon carbide substrate, thereby suppressing the rate of formation of the SiC film.

In addition to suppressing pore generation in the substrate by the application of these conditions, crystals of the SiC film with high thermal shock resistance produced by chemical vapor deposition can be improved by causing the SiC crystals of the (111) plane to be highly oriented on the substrate. This can be achieved by controlling the molar ratio of the carrier gas, such as hydrogen or argon, and the raw material compound at 4–100, preferably 5°, under conditions of a temperature of 1100°–1290° C. and a pressure of 500–760 Torr. If the temperature is lower than 1100° C., the high thermal shock resistance of the SiC film is reduced. If the molar ratio of the carrier gas and the raw material compound is less than 4, crystal nuclei are easily produced on the surface of the silicon carbide substrate. This tends to roughen the formed SiC film and reduces its minuteness; if this molar ratio is more than 100, polycrystals are easily produced in the SiC film and the orientation of SiC crystals in the (111) plane may decrease.

Cracks are produced or peeling occurs in the interface of the silicon-impregnated silicon carbide substrate and the SiC coating film produced by the chemical vapor deposition method when the material is subjected to severe heat cycles such as encountered by a jig for heat treatment. The major reason for this is that the silicon impregnated when the coating is provided by chemical vapor deposition is vaporized to produce pores with a diameter larger than 2 $\mu$m in the layer of the silicon carbide substrate within 200 $\mu$m from the interface of the SiC film. Because the heat treatment jig of the present invention is free from such pores having a diameter larger than 2 $\mu$m in the silicon carbide substrate within 200 $\mu$m from the SiC coating film, the SiC film adheres firmly to the silicon carbide substrate and the jig exhibits excellent durability to severe heat cycles involving rapid heating and cooling.

In addition, the orientation of the crystal structure of the SiC film to the (111) plane can be increased by setting the ratio I(200)/I(111) of the value of the X-ray diffraction intensity of the SiC film at 0.005 or less. The chemical bonding strength of silicon carbide, silicon, and the SiC film constituting the silicon carbide substrate is increased because the (111) plane is the closest packing structure, whereby the high thermal shock resistance of the SiC film is further increased.

Other features of the invention will become apparent in the course of the following description of the exemplary embodiments which are given for illustration of the invention and are not intended to be limiting thereof.

EXAMPLES

Examples 1–6, Comparative Examples 1–2

Silicon in the amount of 20 wt % was impregnated in recrystallized silicon carbide of 50×50×10 m to produce a silicon carbide matrix. This matrix was placed in a circular furnace and degassed under a vacuum of 2×10$^{-3}$ Torr.

After heating to 800° C. at a rate of temperature rise of 20° C./minute, hydrogen gas was introduced to make a pressure of 150 Torr. The furnace was maintained under these conditions for 30 minutes. Then, the temperature was raised at the rate of 20° C./minute to the temperatures listed in Table 1, and the furnace was maintained at these temperatures for 30 minutes. Then, the raw material compound (CH$_3$SiCl$_3$) for forming SiC film was supplied at the different molar ratios of H$_2$/CH$_2$SiCl$_3$ listed in Table 1. In this instance, the pressure in the furnace was adjusted by controlling the amount of the raw material supplied. SiC was coated on the silicon carbide substrate by changing the temperature and pressure in the furnace, and the molar ratio of the gas raw material.

Examples 7–9, Comparative Examples 3–4

A 50×50×10 mm sintered silicon carbide substrate (residual Si: 10 wt %) was degassed under the same conditions as in Example 1 and heated to 700° C. at a temperature rise of 33° C./minute. Argon gas was introduced and the pressure was maintained at 300 Torr for 20 minutes. Then, the temperature was raised at the rate of 10° C./ minute to the temperatures listed in Table 2 and the raw material compounds (SiCl$_4$ and CH$_4$) for forming the SiC film were supplied at the different molar ratios of 2Ar/SiCl$_4$+CH$_4$ listed in Table 2. SiC was coated on the silicon carbide substrate by controlling the temperature and pressure in the furnace in the same manner as in Examples 1–6.

Comparative Example 5

The same silicon carbide substrate was degassed under the same conditions as in Examples 1–6. After heating to 950° C. at a temperature rise of 20° C./minute, hydrogen gas was introduced and the substrate was allowed to stand for 30 minutes under a pressure of 150 Torr. After heating to 1300° C. at a temperature rise of 20° C./minute, a raw material gas (at a molar ratio H$_2$/CH$_3$SiCl$_3$ 4.0) was introduced while maintaining the pressure in the furnace at 200 Torr to produce a SiC film on the silicon carbide substrate.

Comparative Example 6

The same sintered silicon carbide substrate as used in Example 7 was degassed under the same conditions as in the Examples 1–6. After heating to 1100° C. at a temperature rise of 10° C./minute, argon gas was introduced and the substrate was allowed to stand for 20 minutes under a pressure of 15 Torr. After heating to 1200° C. at a temperature rise of 20° C./minute, a raw material gas consisting of SiCl$_4$ and CH$_4$ was supplied at a molar ratio of (2Ar/SiCl$_4$+CH$_4$) of 2.5 while maintaining the pressure in the furnace at 40 Torr.

The resulting SiC-coated silicon carbide materials obtained in the above-mentioned Examples and Comparative Examples were cut and the cross-sections were observed using a scanning electron microscope at a magnification of 400 times to confirm the presence of pores with a diameter larger than 2 $\mu$m existing in the outer layer within the depth of 20 $\mu$m. Furthermore, the X-ray diffraction intensity was measured to determine the ratio I(200)/I(111). The X-ray diffraction was measured under the conditions of an applied voltage of 40 KV, an electric current of 20 mA, filter Cu/Ni, and a divergence slit of 1°.

The temperature and pressure in the furnace when the SiC films are formed, the molar ratio of the raw material gases, the presence or absence of pores with a diameter of 2 $\mu$m or more in the silicon carbide matrix within 200 $\mu$m of the interface of the SiC film and the matrix, the X-ray diffraction intensity, and the ratio of the diffraction intensity are shown in Table 1 and Table 2.

TABLE 1

| | SiC film forming conditions | | | | X-ray diffraction | | |
|---|---|---|---|---|---|---|---|
| | Temp. (°C.) | Pressure (Torr) | Raw*1 material gas | 2 $\mu$m or larger pores*2 | I (200) | I (111) | Ratio*3 |
| Example | | | | | | | |
| 1 | 1000 | 760 | A 9.0 | None | 60 | 10985 | 0.0055 |
| 2 | 1100 | 760 | A 9.0 | None | 84 | 19095 | 0.0044 |
| 3 | 1200 | 760 | A 9.0 | None | 0 | 34410 | 0.0000 |
| 4 | 1250 | 760 | A 7.3 | None | 0 | 62281 | 0.0000 |
| 5 | 1200 | 500 | A 7.3 | None | 65 | 28836 | 0.0023 |
| 6 | 1265 | 760 | A 7.3 | None | 25 | 41037 | 0.0006 |

TABLE 1-continued

SiC film forming conditions

| | Temp. (°C.) | Pressure (Torr) | Raw[*1] material gas | 2 μm or larger pores[*2] | X-ray diffraction I (200) | I (111) | Ratio[*3] |
|---|---|---|---|---|---|---|---|
| Comparative Example | | | | | | | |
| 1 | 1300 | 760 | A 9.0 | Present | 43 | 30866 | 0.0014 |
| 2 | 1200 | 450 | A 7.3 | Present | 370 | 3481 | 0.1063 |
| 5 | 1300 | 200 | A 4.0 | Present | 150 | 25000 | 0.0060 |

[*1]A: Molar ratio of $H_2/CH_3SiCl_3$
[*2]The presence or absence of pores with a diameter of 2 μm or more in the silicon carbide matrix within 200 μm from the interface.
[*3]The ratio of I (200)/I (111) diffraction intensity.

TABLE 2

SiC film forming conditions

| | Temp. (°C.) | Pressure (Torr) | Raw[*1] material gas | 2 μm or larger pores[*2] | X-ray diffraction I (200) | I (111) | Ratio[*3] |
|---|---|---|---|---|---|---|---|
| Example | | | | | | | |
| 7 | 1050 | 600 | B 4.5 | None | 89 | 16790 | 0.0053 |
| 8 | 1150 | 760 | B 15.0 | None | 15 | 54650 | 0.0003 |
| 9 | 1285 | 800 | B 80.0 | None | 104 | 27311 | 0.0038 |
| Comparative Example | | | | | | | |
| 3 | 1150 | 800 | B 150.0 | Present | 420 | 14816 | 0.0283 |
| 4 | 1400 | 500 | B 30.0 | Present | 74 | 32060 | 0.0023 |
| 6 | 1200 | 40 | B 2.5 | Present | 370 | 3481 | 0.1063 |

[*1]B: Molar ratio of $2Ar/(SiCl_4 + CH_4)$
[*2]The presence or absence of pores with a diameter of 2 μm or more in the silicon carbide substrate within 200 μm from the interface.
[*3]The ratio of I (200)/I (111) diffraction intensity.

Next, the resistance to high temperature heating cycles and high thermal shock resistance were tested on these SiC-coated silicon carbide materials according to the following methods.

The resistance to high temperature heating cycles was evaluated by observing the presence or absence of cracks or peeling in the SiC films of the samples after 20 repetitions of a heating cycle consisting of heating the sample in an infrared heating furnace to 1300° C. in 15 minutes, allowing the sample to stand at this temperature, then removing the sample from the furnace and leaving it to cool to the ambient temperature. The high thermal shock resistance was evaluated by observing the presence or absence of cracks or peeling in the SiC films of the samples after the sample was heated for 30 minutes at 500° C. or 1000° C. in an electric furnace, followed by quenching in water at 20° C. The results are shown in Table 3 and Table 4.

TABLE 3

| | Resistance to high temperature heating cycles | High thermal shock resistance | |
|---|---|---|---|
| | | Heating temperature (500° C.) | Heating temperature (1000° C.) |
| Example | | | |
| 1 | No abnormality | No abnormality | Slight peeling |
| 2 | No abnormality | No abnormality | No abnormality |
| 3 | No abnormality | No abnormality | No abnormality |
| 4 | No abnormality | No abnormality | No abnormality |
| 5 | No abnormality | No abnormality | No abnormality |
| 6 | No abnormality | No abnormality | No abnormality |
| Comparative Example | | | |
| 1 | Cracks and slight peeling occurred. | Cracks and slight peeling occurred. | Cracks occurred and a part of the film peeled. |
| 2 | Cracks occurred and a part of the film peeled. | Cracks occurred and a part of the film peeled. | Cracks occurred and film peeled extensively. |
| 5 | Small cracks produced. | Cracks and slight peeling occurred. | Cracks occurred and a part of the film peeled. |

TABLE 4

| | Resistance to high temperature heating cycles | High thermal shock resistance | |
|---|---|---|---|
| | | Heating temperature (500° C.) | Heating temperature (1000° C.) |
| Example | | | |
| 7 | No abnormality | No abnormality | Slight peeling |
| 8 | No abnormality | No abnormality | No abnormality |
| 9 | No abnormality | No abnormality | No abnormality |
| Comparative Example | | | |
| 3 | Cracks and slight peeling occurred. | Cracks occurred and a part of the film peeled | Cracks occurred and film peeled extensively. |
| 4 | Small cracks produced. | Small cracks and slight peeling occurred. | Cracks occurred and a part of the film peeled. |
| 6 | Small cracks produced. | Small cracks and slight peeling occurred. | Cracks occurred and a part of the film peeled. |

The results shown in Tables 1–4 indicates that the SiC-coated silicon carbide materials of the present invention, in which there are no pores with a diameter of 2 μm or more in the outer layer of the silicon carbide substrate within 200 μm from the interface of the matrix and the SiC film, are free from production of cracks or peeling of the film even after repetition of heat treatment consisting of rapid heating and quenching and exhibit superior durability against a thermal shock consisting of quenching to 20° C. from 500° C. In addition, it can be seen from the results of the quenching test to 20° C. from 1000° C. in Tables 3 and 4 that the durability with respect to heat shock is further increased by keeping the ratio I(200)/I(111) of the diffraction strength in the X-ray diffraction of the SiC film at 0.005 or less. In contrast, in the materials prepared in the Comparative Examples in which there are pores in the silicon carbide substrate, cracks were produced and the SiC film was peeled from the substrate.

As described above, because the SiC-coated silicon carbide material of the present invention has superior resistance to high temperature heating cycles and excellent high thermal shock resistance, the material is useful is a jig for heat treatment in semiconductor manufacturing under severe temperature conditions involving rapid cooling from a high temperature to a low temperature.

Obviously, numerous modifications and variations of the present invention are possible in light of the above teachings. It is therefore to be understood that, within the scope of the appended claims, the invention may be practiced other than as specifically described herein.

We claim:

1. A jig used for heat treatment made from an SiC-coated silicon carbide material, wherein a SiC film is coated by the CVD method on a silicon carbide substrate in which silicon has been impregnated and wherein there are no pores with a diameter of 2 $\mu$m or larger in the substrate within 200 $\mu$m from the interface of the SiC film with the substrate.

2. The jig according to claim 1, wherein the ratio of the X ray diffraction intensity of the (200) plane to the (111) plane, I(200)/I(111), is 0.005 or less.

3. In a jig used for heat treatment, the improvement comprising said jig comprising a silicon carbide substrate in which silicon is impregnated and a silicon carbide film formed thereon by chemical vapor deposition of degassing the silicon-impregnated silicon carbide substrate in a chamber at a pressure no greater than 1 Torr and heating at a temperature of 600–850° C. and a heating rate of 5°–50° C./min., introducing a non-oxidative gas into the chamber until the pressure reaches from 50–760 Torr and heating at a heating rate of 5°–50° C./min. to a temperature of 1000°–1290° C. and introducing a raw material for silicon carbide and a carrier gas into the chamber and forming a silicon carbide film on the silicon-impregnated silicon carbide substrate at a temperature of 1000°–1289° C. and a pressure of 500–760 Torr such that there are no pores having a diameter of 2 $\mu$m or larger in the substrate within 200 $\mu$m of the interface of the SiC film with the substrate.

4. The jig according to claim 3, wherein the ratio of the X-ray diffraction of the (200) plane to the (111) plane of the crystals in the SiC film is 0.005 or less.

* * * * *

UNITED STATES PATENT AND TRADEMARK OFFICE
CERTIFICATE OF CORRECTION

PATENT NO. : 5,882,807
DATED : March 16, 1999
INVENTOR(S) : Yoshio FUNATO et al

It is certified that error appears in the above-identified patent and that said Letters Patent is hereby corrected as shown below:

Column 10, line 12; change "1000°-1289°C" to
---1000°-1290°C---.

Signed and Sealed this

Twenty-eighth Day of September, 1999

Attest:

Q. TODD DICKINSON

*Attesting Officer*           *Acting Commissioner of Patents and Trademarks*